US006985468B2

(12) United States Patent  
Arimura

(10) Patent No.: US 6,985,468 B2
(45) Date of Patent: Jan. 10, 2006

(54) MEMORY CIRCUIT AND COHERENT DETECTION CIRCUIT

(75) Inventor: Takuya Arimura, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 833 days.

(21) Appl. No.: 09/926,241

(22) PCT Filed: Feb. 1, 2001

(86) PCT No.: PCT/JP01/00694

§ 371 (c)(1),
(2), (4) Date: Sep. 28, 2001

(87) PCT Pub. No.: WO01/58071

PCT Pub. Date: Aug. 9, 2001

(65) Prior Publication Data

US 2002/0159469 A1   Oct. 31, 2002

(30) Foreign Application Priority Data

Feb. 3, 2000   (JP) .............................. 2000-026306

(51) Int. Cl.
  H04L 27/14   (2006.01)
  H04L 12/28   (2006.01)
  H04L 12/54   (2006.01)
  H04B 7/216   (2006.01)
(52) U.S. Cl. ...................... 370/335; 370/413; 370/429; 375/325
(58) Field of Classification Search ................ 370/235, 370/335, 311, 320, 321, 329, 350, 412, 419, 370/420; 375/324, 316, 325, 147, 240.24
See application file for complete search history.

(56) References Cited

U.S. PATENT DOCUMENTS

| 5,692,015 | A | * | 11/1997 | Higashi et al. | 375/340 |
| 5,982,763 | A | * | 11/1999 | Sato | 370/342 |
| 6,028,887 | A | * | 2/2000 | Harrison et al. | 375/147 |
| 6,078,576 | A | * | 6/2000 | Schilling et al. | 370/347 |
| 6,278,703 | B1 | * | 8/2001 | Neufeld | 370/342 |
| 6,728,302 | B1 | * | 4/2004 | Dabak et al. | 375/148 |
| 6,757,272 | B1 | * | 6/2004 | Abeta et al. | 370/342 |

FOREIGN PATENT DOCUMENTS

EP   0851601   7/1998
EP   0884865   12/1998

(Continued)

OTHER PUBLICATIONS

A technical report of the IEICE (RCS97-3), "Experiments on Wideband Coherent DS-CDMA" by Dohi et al., published Apr. 1997, as well as an English language abstract.

(Continued)

*Primary Examiner*—Hanh Nguyen
(74) *Attorney, Agent, or Firm*—Greenblum & Bernstein, P.L.C.

(57) ABSTRACT

The memory circuit of the present invention temporarily stores information symbols included in a reception signal according to a CDMA system which allows multi-code communication to carry out coherent detection using a pilot symbol. The memory circuit of the present invention is constructed of a plurality of electrically independent memory blocks. Each memory block corresponds to one code and one slot of an information symbol. Write access and read access to memory blocks are generated periodically on condition that write access and read access to one memory block do not occur simultaneously. Blocks to which no access is generated are forcibly set to a low power consumption mode to reduce power consumption caused by accesses.

6 Claims, 6 Drawing Sheets

FOREIGN PATENT DOCUMENTS

| | | |
|---|---|---|
| EP | 0886385 | 12/1998 |
| JP | 5-135592 | 6/1993 |
| JP | 6-36567 | 2/1994 |
| JP | 9-107310 | 4/1997 |
| JP | 10190626 | 7/1998 |
| JP | 10233713 | 9/1998 |
| JP | 10233756 | 9/1998 |
| JP | 11-8568 | 1/1999 |
| JP | 11-186990 | 7/1999 |
| JP | 11177490 | 7/1999 |
| JP | 11786990 | 7/1999 |
| JP | 2000-78107 | 3/2000 |
| JP | 2000174729 | 6/2000 |

OTHER PUBLICATIONS

English Language Abstract of JP 9-107310.
English Language Abstract of JP 11-186990.
English Language Abstract of JP 2000-78107.
English Language Abstract of JP 2000-174729.
English Language Abstract of JP 11-8568.
English Language Abstract of JP 10-233713.
English Language Abstract of JP 10-233756.
English Language Abstract of JP 10-190626.
English Language Abstract of JP 10-177490.
English Language Abstract of JP 5-135592.
English Language Abstract of JP 6-36567.
English Language Abstract of JP 11-177490.

* cited by examiner

MEMORY CIRCUIT AND COHERENT DETECTION CIRCUIT

TECHNICAL FIELD

The present invention relates to a memory circuit and coherent detection circuit.

BACKGROUND ART

In a CDMA (Code Division Multiple Access)-based mobile communication, the amplitude and phase of an information symbol fluctuate under the influence of Raleigh fading.

A "coherent detection system using a pilot symbol" is proposed as a method for carrying out coherent detection by compensating the phase of information symbols on the receiving side.

The coherent detection system using a pilot symbol is a method for carrying out coherent detection by estimating fluctuations in the phase of information symbols using pilot symbols (pilot bits) whose phase is known periodically (for example, every 1.25 ms) inserted in an information signal and compensating the phase of the information symbols through interpolation.

More specifically, the coherent detection system using a pilot symbol repeats an operation consisting of comparing the phase of a demodulated pilot symbol with an ideal phase (original phase) of the pilot symbol and calculating the phase error over a plurality of slots, and determines the phase of the information symbol between neighboring pilot symbols from the phase error calculation result through interpolation and thereby carries out coherent detection.

The coherent detection system using a pilot symbol is described, for example, in "Wideband CDMA Open-Air Transmission Result (RCS97-3)".

FIG. 6 shows a configuration example of a reception signal.

A plurality of pilot symbols (pilot bits) 140, 150, 160 and 170 in FIG. 6 are known symbols inserted for every slot.

Detection target slot 2001 is a 1-slot information symbol to be detected. To compensate the phase of this 1-slot information symbol, the amount of phase fluctuation is estimated using pilot symbols over a few slots before and after the detection target slot.

For example, suppose a signal in the configuration shown in FIG. 6 is being received continuously. Suppose a case where coherent detection is performed using a plurality of pilot symbols 140 to 170. In this case, the information symbol which is the target of coherent detection is information symbol 2001 (that is, the detection target slot), two slots ahead of slot 2003 currently being received.

Thus, it is necessary to temporarily store the previously received information symbols (information symbols up to the one two slots ahead) until the estimation of phase fluctuation using pilot signals (pilot symbols) over a plurality of slots is completed.

That is, a coherent detection circuit requires a memory capable of storing symbols corresponding to at least 3 slots.

On the other hand, a CDMA communication system allows multi-code transmission to speed up communications of large volume image data, etc.

Multi-code transmission is a data transmission system intended to effectively use code resources by changing the number of codes to be multiplexed according to the amount of data.

For example, when sound data or a small-volume packet is transmitted, data is transmitted with one spreading code assigned to one physical channel.

On the other hand, when large-volume data such as a motion picture is sent, the motion picture data is divided into a plurality of physical channels, each physical channel is assigned one spreading code and those divided physical channels are multiplexed to carry out data transmission.

Multi-code transmission does not always use all codes, but dynamically determines codes to be used according to the situation. However, it is necessary to secure the memory area necessary to carry out the above-described coherent detection using a pilot symbol assuming the case where all channels are used.

There are various ways of memory configurations and it goes without saying that it is advantageous in every aspect of the area occupied, power consumption and ease of control, etc. to provide a common memory and control the memory in a concentrated manner rather than providing a plurality of memories and controlling them individually.

However, the following problem may arise in the case where electrically continuous memory areas large enough to store all reception data are provided for when the number of multiplexed channels reaches a maximum in order to be able to respond to dynamic changes in the number of multi-codes.

That is, since the same memory area is accessed regardless of the number of multiplexed codes, the entire memory area becomes the access target even in the case where data is transmitted with one code or where a plurality of codes is multiplexed. As a result, power consumption of the memory circuit always remains unchanged.

Further, in coherent detection using a plurality of pilot symbols over a plurality of slots, memory accesses occur when the information symbol of a slot currently being received is written and the information symbol of a detection target slot is read. That is, it is not necessary to generate memory accesses for other slots.

However, in the symbol storage memory configuration of a conventional coherent detection circuit, memory areas are electrically continuous, and therefore even the memory area which need not be accessed may also be accessed and power is wasted accordingly.

The present invention is implemented based on such consideration and it is an object of the present invention to attain low power consumption in a memory circuit and coherent detection circuit.

DISCLOSURE OF INVENTION

The memory circuit of the present invention divides a memory area for strong information symbols into a plurality of electrically separated memory blocks based on at least one of information on the number of multi-codes and slot information.

Then, the memory circuit of the present invention carries out a data write or data read on each of the plurality of memory blocks periodically.

Blocks not subject to any data write or data read are set to a low power consumption mode.

With such a configuration, only necessary memory blocks become access targets first, which reduces the load on the driver and reduces power consumption. Furthermore, forcibly setting memory blocks which need not be accessed to a low power consumption mode (for example, stopping the supply of an operating clock and setting a non-operating state) further enhances the effect of reducing power consumption.

A mode of the memory circuit of the present invention delimits the memory area of the information symbol storage memory for every code number of multi-code communication and divides it into a plurality of memory blocks. Then, by taking measures such as stopping a clock supply to memory blocks storing information symbols that need not be written or read, the memory circuit of the present invention reduces power consumption.

Furthermore, another mode of the memory circuit of the present invention electrically delimits the memory area for every reception slot and divides it into a plurality of memory blocks. Then, the memory circuit individually generates write access or read access to the memory block corresponding to the detection target slot and the memory block corresponding to the slot currently being received.

Furthermore, the coherent detection circuit of the present invention includes the memory circuit of the present invention, an interpolation section that corrects the phases of information symbols through interpolation and a coherent detection section. Since memory power consumption is reduced, power consumption of the coherent detection circuit is also reduced.

A mode of the coherent detection circuit of the present invention electrically delimits the memory area of the symbol storage memory incorporated in the coherent detection section for every multiplexed code and divides it into a plurality of memory blocks. The coherent detection circuit then operates only memory blocks in response to the dynamically variable number of codes. When the number of codes used is small, the coherent detection circuit forcibly sets memory blocks not in used to a low power consumption mode by stopping the supply of the operating clock, etc. Low power consumption of the circuit is attained in this way.

BEST MODE FOR CARRYING OUT THE INVENTION

With reference now to the attached drawings, an embodiment of the present invention will be explained in detail below.

(Embodiment 1)

Figure 1:
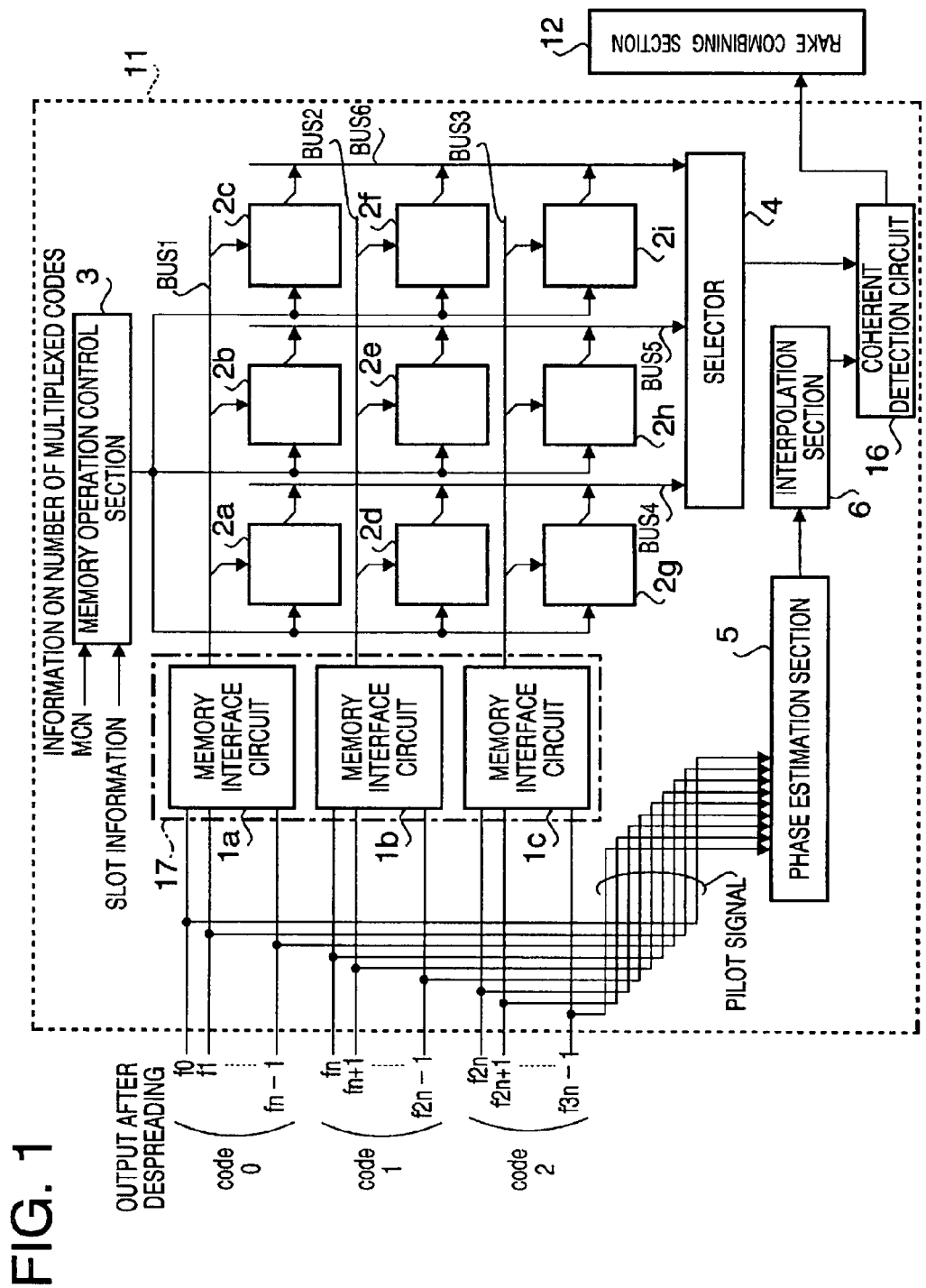
FIG. 1 is a block diagram showing an overall configuration of an embodiment of a coherent detection circuit of the present invention.
Figure 2:
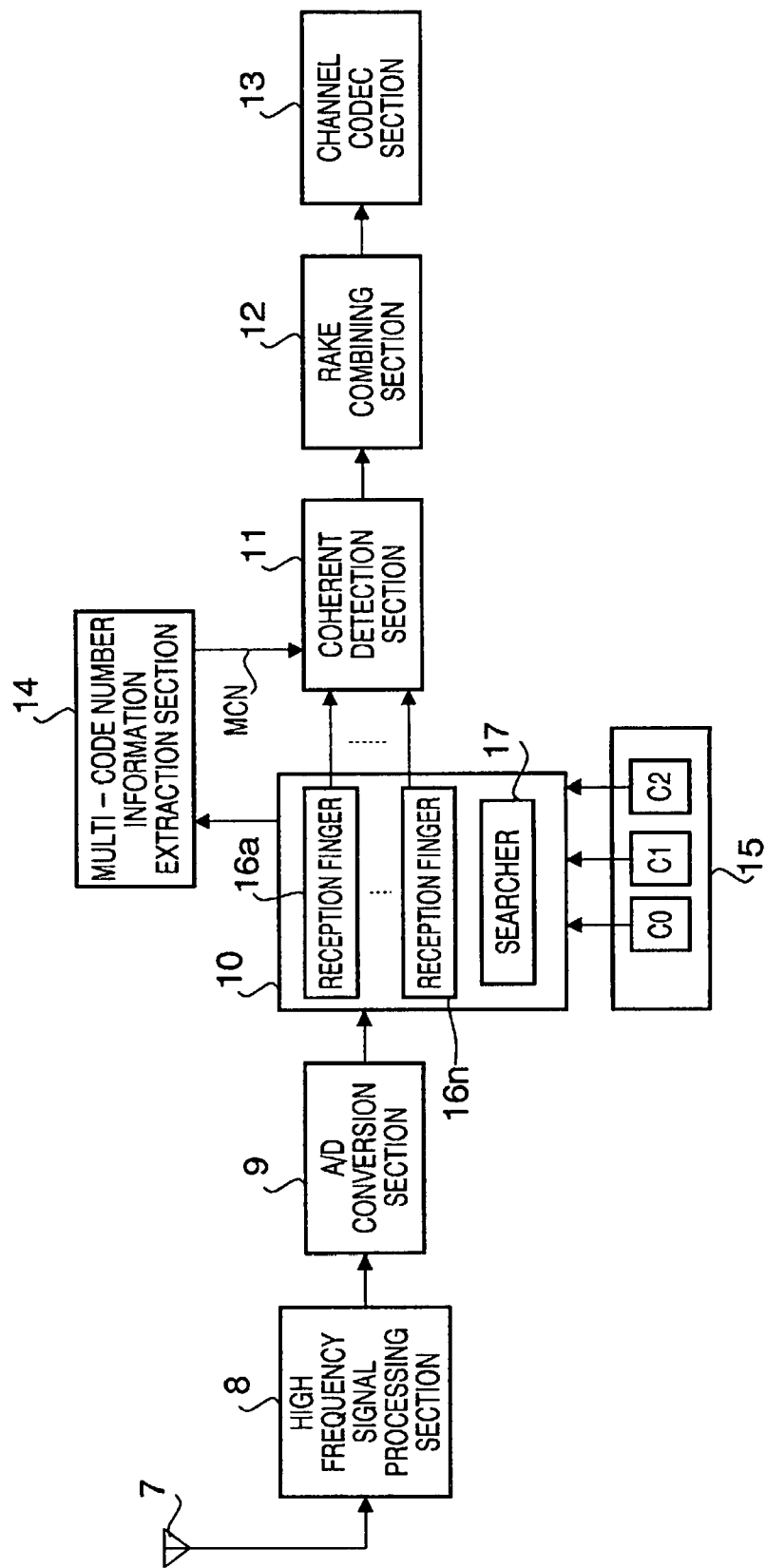
FIG. 2 is a block diagram showing a configuration of a receiver using the coherent detection circuit of the present invention.

FIG. 1 is a block diagram of a coherent detection circuit according to Embodiment 1 of the present invention. FIG. 2 is a block diagram showing a configuration of a CDMA receiver (RAKE combining) using the coherent detection circuit of the present invention.

First, an overall configuration of the CDMA receiver will be explained.

As shown in FIG. 2, a CDMA receiver includes reception antenna 7, high frequency signal processing section 8, A/D conversion section 9 that converts an analog signal to digital signal, despreading section 10 that despreads the reception signal at predetermined timing and demodulates data, coherent detection section 11 that carries out coherent detection on the despread data, RAKE combining section 12 that RAKE-combines signals subjected to despreading and coherent detection corresponding to a plurality of paths, channel CODEC section 13 that carries out channel decoding and multi-code number information extraction section 14 and despreading code generation section 15.

Despreading section 10 is provided with a plurality of reception fingers 16a to 16n and searcher 17.

Multi-code number information extraction section 14 extracts information indicating the number of codes inserted in the reception signal and in use and gives this information to coherent detection section 11.

Furthermore, despreading code generation section 15 generates, for example, three despreading codes C0 to C2 and supplies these codes to despreading code generation section 15.

A reception signal is demodulated to a baseband signal at high frequency signal processing section 8, A/D-converted to digital data and then input to despreading section 10.

At despreading section 10, the reception signal is subjected to despreading processing by a plurality of despreaders and the data is demodulated. The despreaders are determined taking into account the number of multi-paths and the number of multiplexed codes, etc.

Coherent detection section 11 and RAKE combining section 12 compensate the plurality of data items for the phases of multi-paths for every code and carry out RAKE combining.

Next, a configuration and operation of coherent detection section 11 will be explained with reference to FIG. 1, FIG. 3A, FIG. 3B, FIG. 4A, FIG. 4B, FIG. 5 and FIG. 6.

Coherent detection section 11 shown in FIG. 1 temporarily stores the despread data output from reception fingers 16a to 16n in FIG. 2, carries out phase compensation and coherent detection.

As shown in FIG. 1, coherent detection section 11 includes a plurality of memory blocks 2a to 2i which are physically (electrically) separated from one another, memory interface section 17 (including memory interface circuits 1a to 1c), memory operation control section 3, selector 4, phase estimation section 5, interpolation section 6 and coherent detection circuit 16.

In the figure, BUS 1 to BUS 3 are write buses and BUS 4 to BUS 6 are read buses.

Memory blocks 2a to 2i each temporarily store 1-slot information symbol data. Each of memory blocks 2a to 2i corresponds to "one code"and "one slot". That is, the memory area for storing information symbols is divided into a plurality of blocks based on code information and slot information.

In FIG. 1, "code unit division" means division of the memory area into three traverse lines. In this way, the memory area is divided into 9 electrically independent memory blocks $2a$ to $2i$.

Here, being "electrically independent" specifically means that the word lines are separated from the bit lines.

Dividing the memory area into a plurality of blocks allows only necessary blocks to be accessed.

That is, separating the word lines from the bit lines reduces the load on the drivers (word line driver and bit line driver) necessary for memory accesses and reduces the amount of charging/discharging current, making it possible to reduce power consumption.

In addition, forcibly stopping the supply of the operating clock to unused memory blocks makes the main circuit of the relevant block operate in a low power consumption mode. This also reduces the operating current of the circuit, further reducing power consumption.

Memory interface section 17 is a kind of address decoder and determines which address of which memory block should be accessed.

Memory operation control section 3 selects memory blocks to be activated and memory blocks to be set to a low power consumption mode as appropriate, outputs control signals and controls the operating modes of memory blocks.

Memory operation control section 3 is fed with information on the multiplexed code numbers (MCN) output from multi-code number information extraction section 14 in FIG. 2.

Memory operation control section 3 selects only the memory block line (traverse line) corresponding to the code (multiplexed code) actually being used and deselects other memory block lines.

The selected memory block line is periodically accessed in a predetermined sequence. A specific operating procedure thereof will be described later.

Furthermore, phase estimation section 5 extracts pilot signals inserted at one-slot intervals from each reception signal an estimates the phases of pilot signals on the phase plane (channel estimation).

Interpolation section 6 determines the phase of an information symbol between two neighboring pilot signals through interpolation.

Coherent detection circuit 16 carries out coherent detection on information symbols read from memory blocks at timing corresponding to the phases corrected through interpolation.

The signal subjected to coherent detection is given to RAKE combining section 12.

An overall operation of the coherent detection circuit in FIG. 1 will be explained more specifically.

Despread information symbols f0 to fn-1, fn to f2n-1, f2n to f3n-1 are information corresponding to code 1, code 2 and code 3, respectively.

Data corresponding to each code includes n signals from path (0) to path (n-1). Signals of different paths have the same information content but have different amounts of delay. Delay differences are on the order of several chips.

Despread information symbols f0 to fn-1, fn to f2n-1, f2n to f3n-1 are each assigned specific address numbers and slot numbers.

The number of addresses of information symbols f0 to fn-1, fn to f2n-1, f2n to f3n-1 is equal to the number of symbols mapped within one slot of the channel received.

Each address of information of f0 to fn-1, fn to f2n-1, f2n to f3n-1 is given an off set to avoid overlapping. That is, each piece of data is prevented from being written into a same memory space.

Memory interfaces $1a$ to $1c$ in FIG. 1 are each fed with despread information symbols f0 to fn-1, fn to f2n-1, f2n to f3n-1 of the same code. That is, despread information symbols for every path to be subjected to RAKE combining are input.

Memory interfaces $1a$ to $1c$ each serially send information symbols and addresses corresponding to n paths (n: natural number of 2 or greater) which have been input in parallel to the write buses (BUS 1 to BUS 3). As a result, the information symbol data is temporality stored in corresponding memory blocks $2a$ to $2i$.

On the other hand, the information symbol data stored for a period of time corresponding to 2 slots is selected by selector 4 and sent to coherent detection circuit 16.

The coherent detection circuit carries out coherent detection at timing corresponding to the phase compensated by interpolation section 6. The signal subjected to coherent detection is sent to RAKE combining section 12 and RAKE-combined there.

Then, with reference to FIG. 3A, FIG. 3B, FIG. 4A and FIG. 4B, the configuration and operation of the symbol storage memories (memory blocks $2a$ to $2i$) shown in FIG. 1 will be explained more specifically.

Figure 3A:
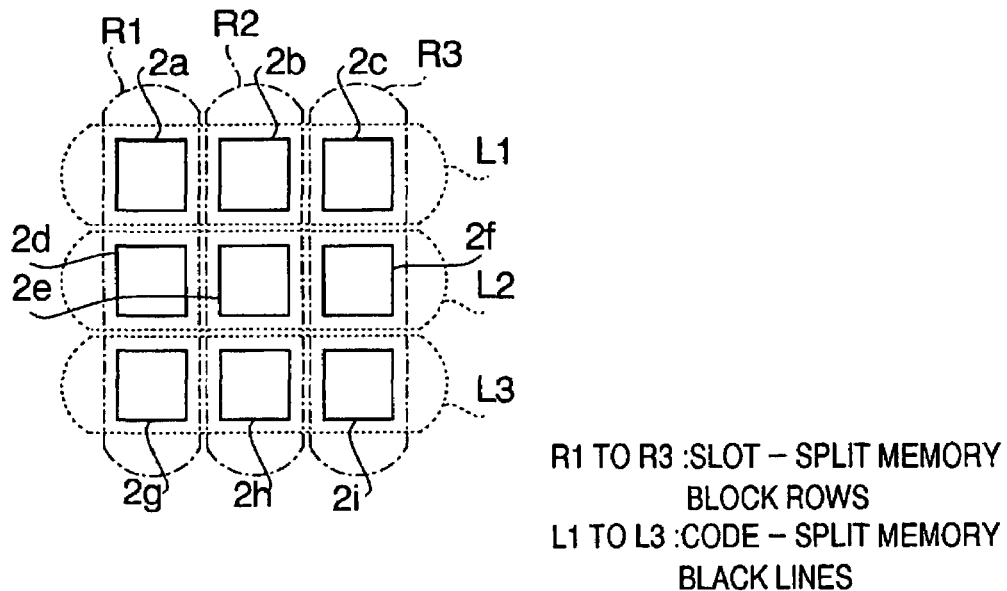
FIG. 3A illustrates features of a configuration of a memory circuit (symbol storage memory) of the present invention.

As shown in FIG. 3A, the memory area for storing information symbols is divided into three memory block lines (L1 to L3) for the respective codes in order to respond to the case where the code multiplexing number is "3".

Furthermore, the memory area is also divided into three memory block rows R1 to R3 for the respective slots so as to temporarily store information symbols corresponding to three slots while the phase is being estimated from pilot symbols corresponding to two slots before and after the slot to be detected (4 pilot symbols in total). Memory cells are constructed of an SRAM which requires no refreshing.

As a result of such memory area divisions, 9 electrically independent memory blocks $2a$ to $2i$ are formed.

That is, the memory area is divided using the number multiplexed codes and slot number as variables. By the way, it is not possible to carry out a read and write on one memory block simultaneously. However, while data is being written to one memory block, data can be read from another memory block at the same time.

Then, the procedure for accessing each memory block will be explained using FIG. 3B.

In the following explanations, suppose the number of multiplexed codes is "1" for convenience of explanations.

When the number of codes is "1", slot number "1" is assigned to a plurality of portions of data (f0 to fn-1) with different amounts of delay about the information symbol of the first despread slot and the respective portions of data are written to memory block $2a$. This state is "state 1".

Figure 3B:
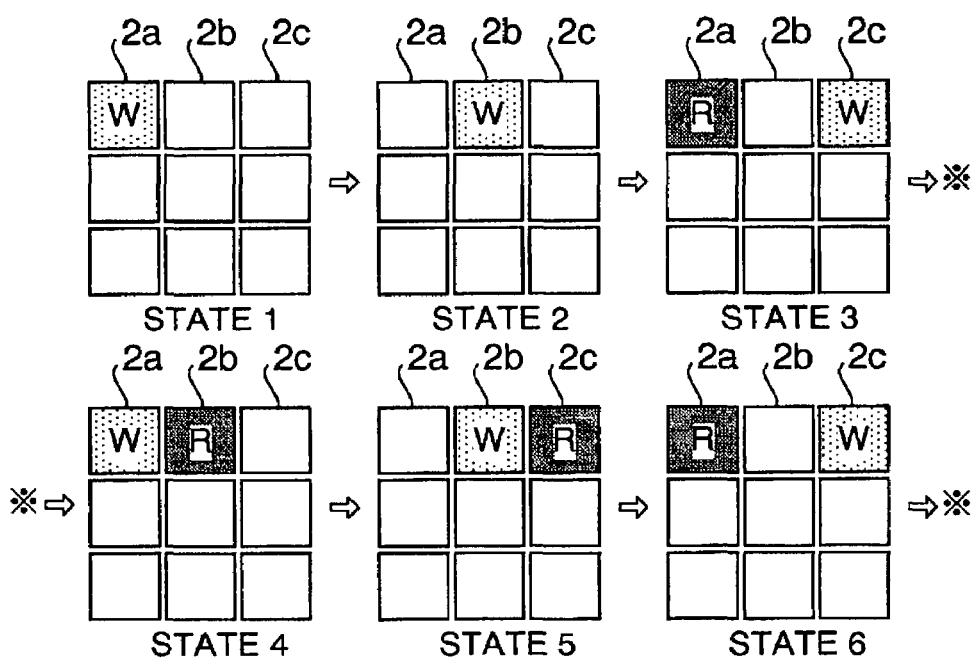
FIG. 3B illustrates a sequence of write accesses and read accesses of the memory circuit (symbol storage memory) of the present invention.

In FIG. 3B, write access is described as "W" and read access is described as "R".

Then, likewise, slot number "2" is assigned to a plurality of portions of data (f0 to fn-1) with different amounts of delay about the information symbol of the second slot and the data is written to memory block $2b$. This state is "state 2".

Furthermore, slot number "3" is assigned about the information symbol of the third slot and the data is written to memory block 2c. At the same time, the data about the information symbol stored two slots ahead is read from memory block 2a. This state is "state 3".

The information symbol data read in state 3 is sent to coherent detection circuit 16 in FIG. 1.

Slot number "1" is assigned to the fourth slot data again and the data is overwritten to memory block 2a whose read has been completed. At the same time, the data about the information symbol stored two slots ahead is read from memory block 2b band sent to coherent detection circuit 16 in FIG. 1. This state is "state 4".

Likewise, the process moves on to state 5 and then state 6. Since state 6 is the same as state 3, the process moves on to state 4 after state 6, and state 4, state 5 and state 6 appear repeatedly thereafter.

Thus, data is written for every slot, in the order of memory block 2a, 2b and 2c. After a write to memory block 2c is completed, the process returns to memory block 2a and a write is performed sequentially again and this procedure is repeated.

On the other hand, information symbol data is read starting from the memory block for which a write has completed two slots ahead relative to the memory block currently being written.

As is apparent from FIG. 3B, not more than two of the three memory blocks operate in the memory block line corresponding to one code in each of states 1 to 6, and therefore there are always memory blocks which need not be operated.

That is, accesses to memory blocks are generated only when information of the "detection target slot", is read and when information of the "slot currently being received" is written.

Therefore, setting memory blocks which need not be operated to a low power consumption mode makes it possible to reduce power consumption. The low power consumption mode of a memory block is implemented by, for example, stopping a clock supply to drive the word lines or bit lines.

The configuration of the present invention can implement operations ① to ④ below.

① It is possible to control so as to prevent write access and read access to a same memory block from occurring simultaneously.

② It is possible to carry out write access and read access to a memory block periodically.

③ It is possible to set a low power consumption mode (non-operating mode) for memory blocks to which no access is generated by stopping the circuit operation or stopping operation of part of the circuit.

That is, it is possible to prevent accesses to memory cells making up the SRAM from being generated. This reduces power consumption to at least two thirds of conventional power consumption.

④ Furthermore, in the example above, only the memory block line corresponding to code 1 (L1 in FIG. 3A) operates and memory block lines L2 and L3 corresponding to code 2 and code 3 do not operate at all. This can completely stop the operations of memory blocks 2d to 2i that belong to memory block lines L2 and L3.

In this case, as is apparent from FIG. 3A, too, it is only two of the 9 physically (electrically) delimited memory blocks that operate and other memory blocks do not operate.

Therefore, when the number of codes is 1, if power consumption is compared simply focused on the operation ratio, the present invention can reduce power consumption to two-ninths of the conventional configuration.

Thus, the present invention makes it possible to effectively reduce power consumption of the memory circuit for storing information symbols.

Then, the case where the number of multiplexed codes is "2" will be explained.

In this case, memory block lines L1 and L2 operate for code 1 and code 2 respectively and memory block line L3 does not operate. Thus, it is possible to stop the operation of memory block line L3.

Thus, it is 4 of the 9 physically (electrically) delimited memory blocks that operate simultaneously and if power consumption is compared simply focused on the operating ratio, the present invention can reduce power consumption to four-ninths of the conventional configuration.

Likewise, when the number of multiplexed codes is "3", write or read operations occur in all memory block lines L1 to L3. Thus, it is 6 of the 9 physically (electrically) delimited memory blocks that operate simultaneously and if power consumption is compared simply focused on the operating ratio, the present invention can reduce power consumption to six-ninths of the conventional configuration.

Figure 4A:
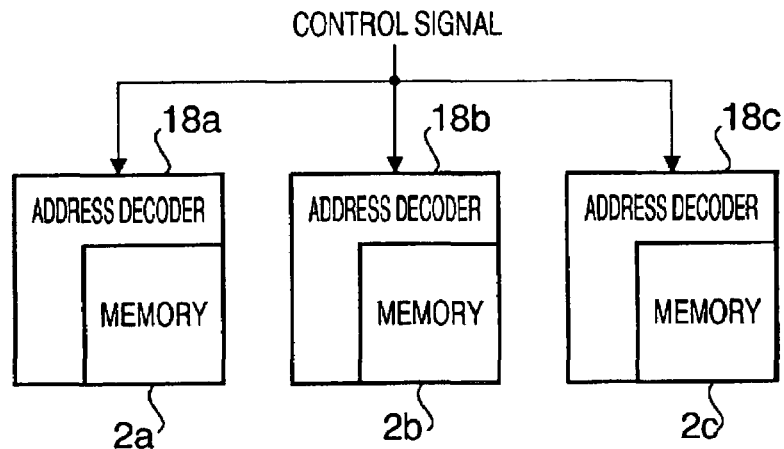
FIG. 4A is a block diagram showing a configuration example of the memory circuit (symbol storage memory) of the present invention.
Figure 4B:
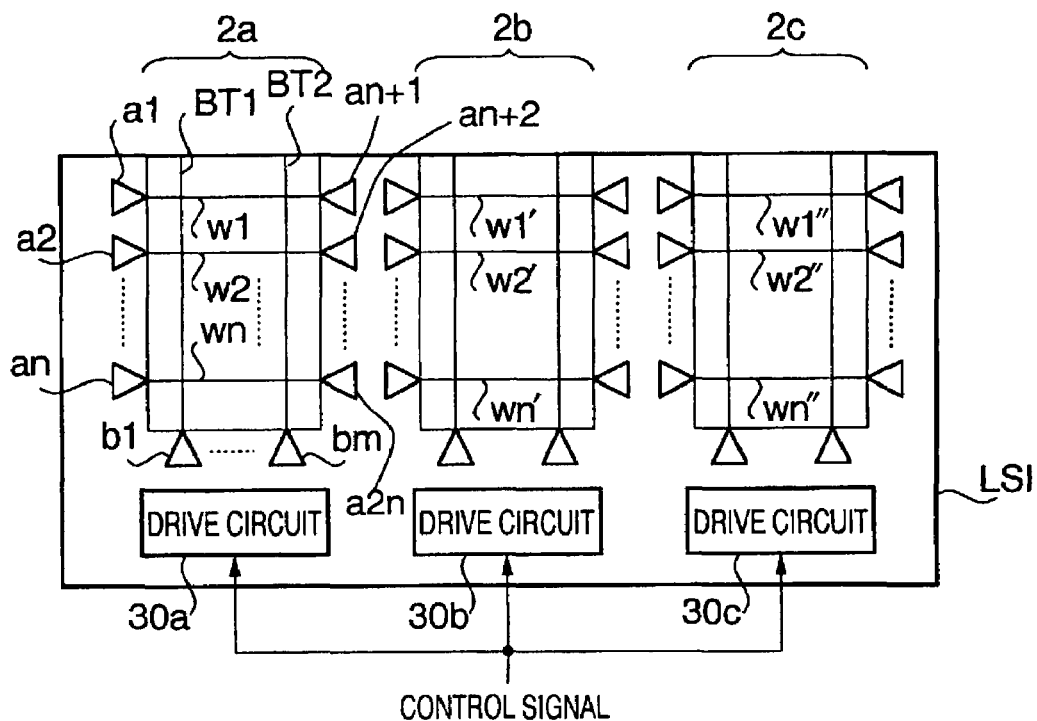
FIG. 4B is a circuit diagram showing a configuration example of the memory circuit (symbol storage memory) of the present invention integrated on a single semiconductor chip.

FIG. 4A and FIG. 4B show specific configuration examples of memory blocks (for example, 2a to 2c).

Control of switching between operation/non-operation of a plurality of memory blocks can be implemented as shown in FIG. 4A by stopping a clock supply necessary to drive the bit lines and word lines at address decoders 18a, 18b and 18c of the respective memory blocks using a gate circuit, etc.

FIG. 4B shows a specific circuit configuration. In FIG. 4B, memory blocks 2a to 2c are integrated on a single chip. The word lines (w1 to wn, w1' to wn", w1" to wn") of the respective memory blocks are electrically separated. Likewise, the bit lines are also driven independently.

Driving the word lines and bit lines at the respective memory blocks is controlled by drive circuits 30a, 30b and 30c.

The configuration and operation of memory block 2a will be explained below.

In FIG. 4B, a1 to a2n denote word line (W1 to Wn) drivers and b1 to bm denote bit line (BT1 to BTm) drivers.

Then, drivers (a1 to a2n, b1 to bm) are controlled by drive circuits (30a to 30c) for the respective memories. Therefore, it is possible to individually control active/non-active of each memory by controlling a clock supply at each drive circuit.

As shown above, it is possible to reduce power consumption to two-ninths to six-ninths of that of the memory circuit of the conventional coherent detection circuit by delimiting physically (electrically) the memory area for information symbol storage based, on the number of multiplexed codes and slot number.

In the above explanations, the number of multiplexed codes is assumed to be "3", but the present invention is not limited to this. The effect of reducing power consumption of the present invention is enhanced as the number of multiplexed codes increases.

Moreover, in the above explanations, the number of information symbol slots stored is assumed to be 3 slots, but the present invention is not limited to this.

The CDMA receiver shown in FIG. 2 has coherent detection section 11 with reduced power consumption, and therefore is suited to LSI implementation. Furthermore, it also allows cellular phone batteries to last longer.

Figure 5:
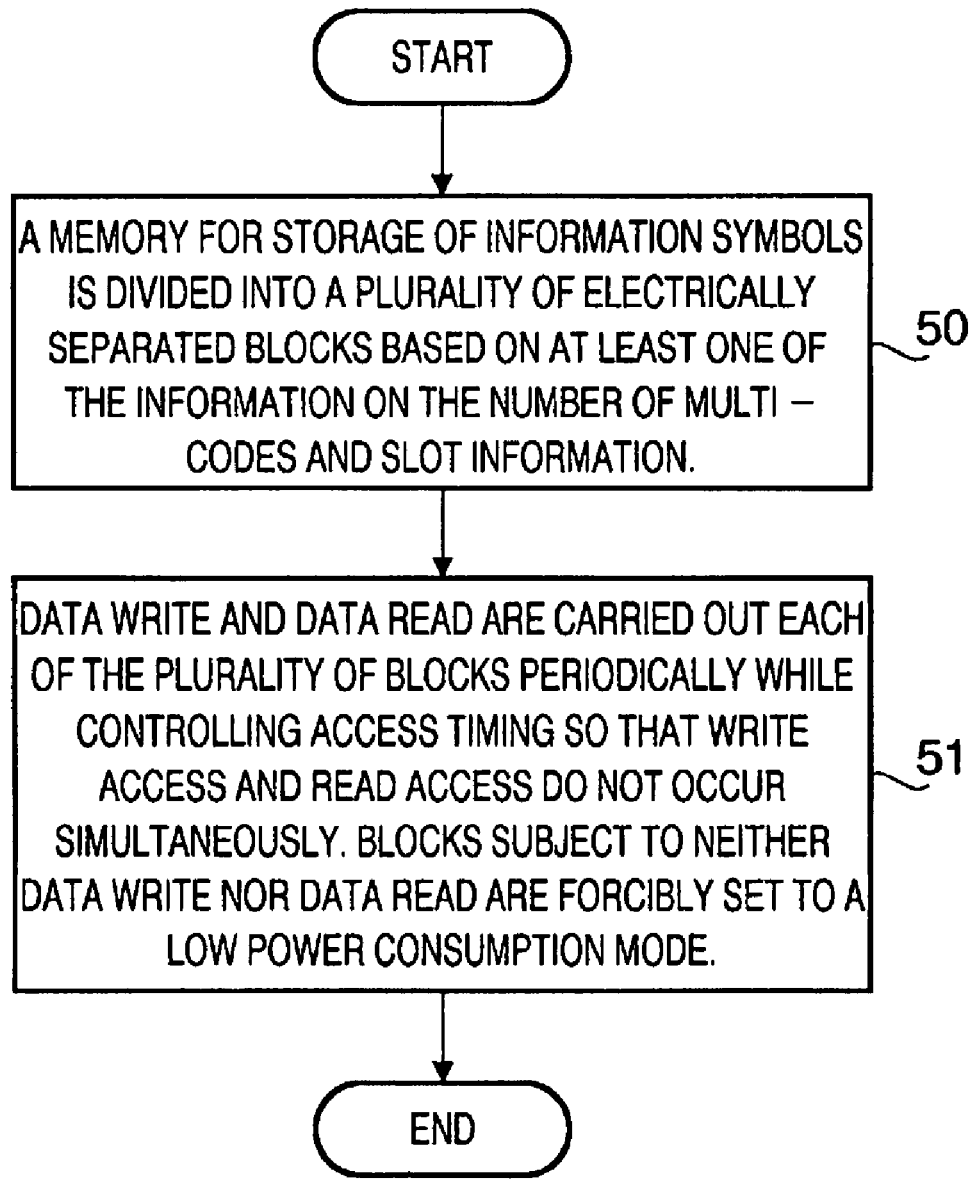
FIG. 5 is a flow chart showing a characteristic operation of the memory circuit of the present invention.
Figure 6:
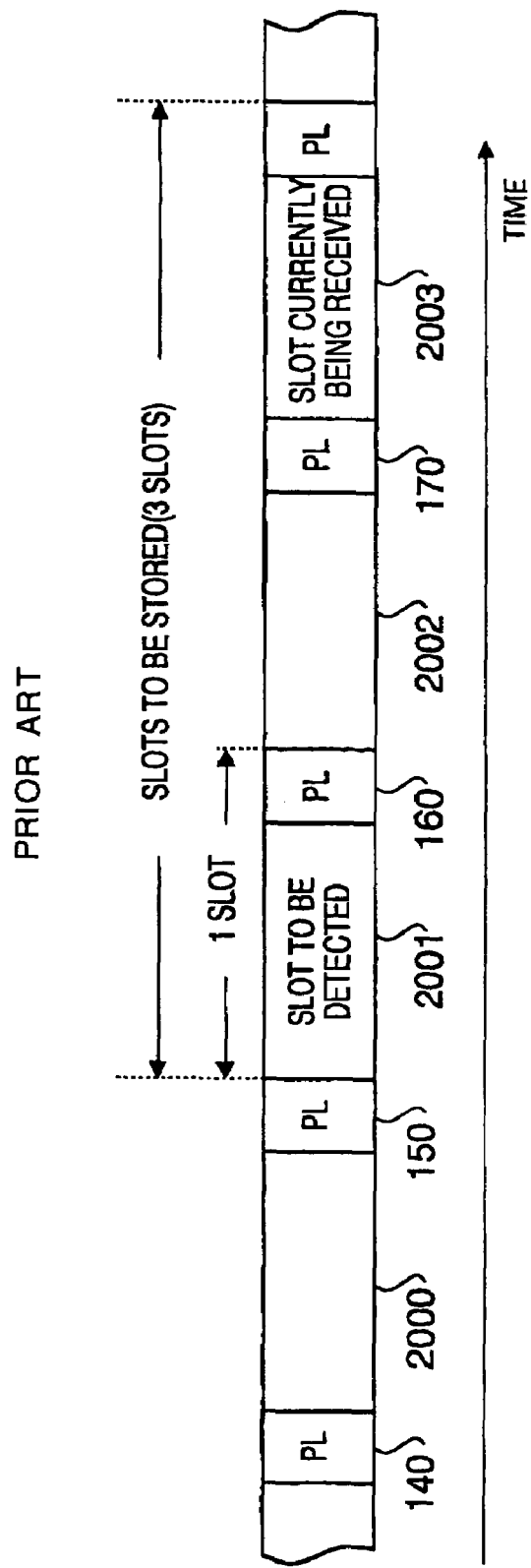
FIG. 6 illustrates a format example of a reception signal used to carry out coherent detection using a pilot symbol.

As described above, the characteristic operations of the memory circuit of the present invention can be summarized in FIG. 5.

A memory for storage of information symbols is divided into a plurality of electrically separated (electrically independent) blocks based on at least one of the information on the number of multi-codes and slot information beforehand (step 50).

Then, data write and data read are carried out on each of the plurality of blocks periodically while controlling access timing so that write access and read access do not occur simultaneously. Blocks subject to neither data write nor data read are forcibly set to a low power consumption mode (step 51).

Thus, the present invention can minimize power consumption associated with memory accesses by dividing a memory area into a plurality of blocks and individually controlling operations of the respective blocks. Thus, the present invention allows cellular phone batteries to last longer even if communications of large-volume data such as moving pictures are carried out.

This application is based on the Japanese Patent Application No. 2000-026306 filed on Feb. 3, 2000, entire content of which is expressly incorporated by reference herein.

INDUSTRIAL APPLICABILITY

The present invention can be applied to a memory circuit or coherent detection circuit mounted on a CDMA receiver.

What is claimed is:

1. A memory circuit for temporarily storing information symbols to receive a signal according to a CDMA system which allows multi-code communication and to perform coherent detection using a pilot symbol, the memory circuit comprising:

a plurality of electrically independent memory blocks, each memory block being associated with a code in the multi-code communication and a slot in a reception signal; and a memory interface that periodically performs data write and data read with said plurality of blocks so as not to allow write access and read access to one memory block at a same time;

wherein the memory interface selectively accesses a memory block associated with a slot subject to coherent detection and a memory block associated with a slot currently being received.

2. The memory circuit of claim 1, further comprising:

a memory operation controller that sets memory blocks to which no access is made in a low power consumption mode.

3. The memory circuit according to claim 2, wherein the low power consumption mode of the memory blocks is implemented by stopping supply of an operating clock.

4. The memory circuit of claim 1, wherein said memory interface periodically performs data write and data read with said plurality of blocks so as not to allow write access to one memory block during a read access to said one memory block, and so as not to allow a read access to said one memory block during a write access to said one memory block.

5. An information symbol storage memory access control method, comprising:

providing an information symbol storage memory in which a memory area is divided into a plurality of electrically independent memory blocks based on at least one of information about the number of multi-codes and slot information;

selectively accessing a memory block associated with a slot subject to coherent detection and a memory block associated with a slot currently being received; and periodically performing data write and data read with the plurality of blocks so as not to allow write access and read access to one memory block at a same time.

6. The information symbol storage memory access control method of claim 5, wherein said periodically performing comprises periodically performing data write and data read with said plurality of blocks so as not to allow write access to one memory block during a read access to said one memory block, and so as not to allow a read access to said one memory block during a write access to said one memory block.

* * * * *

UNITED STATES PATENT AND TRADEMARK OFFICE
CERTIFICATE OF CORRECTION

PATENT NO.        : 6,985,468 B2                                            Page 1 of 1
APPLICATION NO.   : 09/926241
DATED             : January 10, 2006
INVENTOR(S)       : T. Arimura It is certified that error appears in the above-identified patent and that said Letters Patent is hereby corrected as shown below:

On the Title page, at Item (56), References Cited, the following U.S. Patent Document was omitted and should be included:

--5,881,057 03/09/99 Komatsu--

Signed and Sealed this

Fourth Day of July, 2006

JON W. DUDAS
*Director of the United States Patent and Trademark Office*